US006967876B2

(12) United States Patent
Rolandi et al.

(10) Patent No.: US 6,967,876 B2
(45) Date of Patent: Nov. 22, 2005

(54) METHOD FOR CONTROLLING PROGRAMMING VOLTAGE LEVELS OF NON-VOLATILE MEMORY CELLS, THE METHOD TRACKING THE CELL FEATURES, AND CORRESPONDING VOLTAGE REGULATOR

(75) Inventors: Paolo Rolandi, Voghera (IT); Luigi Pascucci, Sesto S. Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 138 days.

(21) Appl. No.: 10/651,019

(22) Filed: Aug. 28, 2003

(65) Prior Publication Data

US 2005/0068803 A1 Mar. 31, 2005

(51) Int. Cl.[7] ............................................ G11C 11/34
(52) U.S. Cl. ............................. 365/189.09; 365/185.2
(58) Field of Search ......................... 365/189.09, 185.2

(56) References Cited

U.S. PATENT DOCUMENTS

| | | | | |
|---|---|---|---|---|
| 5,463,586 A * | 10/1995 | Chao et al. | ................. | 365/210 |
| 5,497,119 A * | 3/1996 | Tedrow et al. | .............. | 327/540 |
| 6,700,819 B2 * | 3/2004 | Pascucci | ................ | 365/185.21 |
| 6,707,718 B1 * | 3/2004 | Halim et al. | ........... | 365/185.22 |

FOREIGN PATENT DOCUMENTS

EP 1 365 417 A1 11/2003

* cited by examiner

*Primary Examiner*—Michael Tran
(74) *Attorney, Agent, or Firm*—Lisa K. Jorgenson; Dennis M. de Guzman; Seed IP Law Group PLLC

(57) ABSTRACT

A method for controlling programming voltage levels of non-volatile memory cells comprises: providing a resistive divider connected to a programming voltage reference and effective to generate at least one programming voltage level; and providing a reference cell crossed by a cell current. Advantageously according to an embodiment of the invention the cell current is applied to the resistive divider to correlate the programming voltage level to the intrinsic features of the reference cell. A programming voltage regulator of non-volatile memory cells comprises at least an input stage inserted between a first and a second voltage reference and connected to a reference memory cell, as well as, in correspondence with its output terminal, to a resistive divider, inserted in turn between a programming voltage reference and the second voltage reference and connected to at least an output terminal of the regulator, effective to supply the programming voltage to the non-volatile memory cells. Advantageously according to an embodiment of the invention, the output terminal of the input stage is connected to a first circuit node of the resistive divider in correspondence with an end of a resistive element comprised in the resistive divider and having a further end connected to the programming voltage reference. In such a way, a voltage value obtained by shunting the programming voltage reference is applied at the first circuit node. The voltage regulator according to embodiments of the invention can be used in two-level contexts and in multilevel contexts, even for parallel programming of several multilevel memory cells.

37 Claims, 6 Drawing Sheets

METHOD FOR CONTROLLING PROGRAMMING VOLTAGE LEVELS OF NON-VOLATILE MEMORY CELLS, THE METHOD TRACKING THE CELL FEATURES, AND CORRESPONDING VOLTAGE REGULATOR

BACKGROUND OF THE INVENTION

1. Field of the Invention

The present disclosure relates to a method for controlling programming voltage levels of non-volatile memory cells correlated to the cell features.

More particularly, but not exclusively, the present disclosure relates to a method for controlling programming voltage levels of non volatile-memory cells comprising:

providing a resistive divider connected to a programming voltage reference and effective to generate at least one programming voltage;

providing a reference cell crossed by a cell current.

The present disclosure also relates to a programming voltage regulator of non-volatile memory cells.

More specifically but not exclusively, the present disclosure relates to a programming voltage regulator of non-volatile memory cells of the type comprising at least an input stage inserted between a first and a second voltage reference and connected to a reference memory cell, as well as, in correspondence with an output terminal thereof, to a resistive divider, inserted in turn between a programming voltage reference and said second voltage reference and connected to at least an output terminal of said regulator, effective to supply said programming voltage to said non-volatile memory cells.

2. Description of the Related Art

As it is well known, non-volatile memory devices, particularly EEPROM and FLASH devices, are used to store large amounts of data, for example in the digital audio and video field which is presently rapidly growing. In fact, digital audio and video applications require memory devices having increasing sizes to satisfy the need to store several musical tracks on a same medium or to increase photographic quality, for example by increasing the number of shooting pixels.

Non-volatile multilevel memories have recently come into the market, i.e., memories in which several information bits can be stored per cell. These memories seem to be particularly effective to satisfy the above needs.

Known memory devices use as elementary cell a floating gate MOS transistor and they exploit the possibility of modulating the cell threshold voltage to distinguish two logic states. A first logic state (logic "1") corresponds to a situation in which the floating gate does not comprise any charge, typical for example of a virgin or erased cell. Another logic state (logic "0") corresponds to the case in which the floating gate stores a number of electrons being sufficient to determine a macroscopic increase of the threshold thereof, thus determining the programmed cell state.

These devices must be thus equipped with suitable voltage regulators for generating programming voltages and storing the charge in the floating gate. It should be noted that programming voltages should be kept in a limited range of values in order to ensure a correspondence between a generic programming pulse and a corresponding threshold voltage step of programmed cells.

In multilevel memories the charge stored in the floating gate is further split, generating a number of distributions corresponding to $2^{nb}$ where "nb" is the number of bits to be stored in a single cell. In this case, even more precise voltage regulators should be used, which respect the distance reduction in terms of threshold between the different distributions.

In the case of a multilevel memory, the difference reduction between the threshold voltages corresponding to the different levels of charge storable in the floating gate and, thus, between the different cell conduction levels requires therefore a "fine" and precise control of the cell programming phase and particularly of the charge stored during this phase in the floating gate terminal.

In presently marketed non-volatile memory devices, two-level or multilevel, it is known to perform the cell programming phase by applying at the control gate terminal thereof a stepped voltage which increases linearly.

In practice a series of gate programming pulses differing from each other for a constant value ΔVG is used. The gate programming voltage is thus a constant pitch stepped slope while the voltage at the drain terminal and the pulse duration depend on and are determined by the cell manufacturing process.

At the end of each programming pulse, a control phase of the obtained result is performed, to verify that the desired threshold level is reached and, consequently, to stop or continue the programming phase.

It is thus possible to program multilevel memory cells at a desired threshold voltage value, by using a predetermined number of programming pulses.

The main problem of the above-described method is the intrinsic slowness thereof. In fact, multilevel cell programming requires the application of a series of pulses to the cell control gate, starting from the lowest level, which requires more time than the single programming pulse used for two-level cells. Moreover, each level is reached only after defining the immediately lower level.

To overcome these difficulties, the Applicant itself has provided in the European patent application no. 02425293.4 filed on May 13, 2002 a programming method providing the application at drain terminals of a given memory word cells to be programmed of different voltage values according to the threshold to be reached. The different drain voltages, corresponding each to a predetermined level, are chosen so as to favor the corresponding level to be reached substantially simultaneously to the others, after an appropriate number of pulses independently from the required final level.

Obviously, same drain voltage values will be applied to obtain same-level bits.

The appropriate number of pulses should meet two requirements; it should be the lowest possible, but in the meantime it should ensure a convenient and controlled precision in reaching each level.

In particular, the programming phase should be calibrated to ensure working levels and the division thereof being advantageously technology-linked and with a compensation feature both of the supply and of the temperature conditions in order to obtain the lowest number of programming pulses with a uniform distribution of cell threshold voltage variations.

In practice, moreover, the cell threshold voltages variations of the cell programming efficiency, or more generally of the physical features of each cell after the manufacturing process, and of supply voltage values make it difficult to obtain an efficient programming phase, since little uniform answers are obtained with very heterogeneous contexts.

The control of the programming phase is much more important when operating in "fine" regulation contexts, such as multilevel applications or with trapping devices.

It is thus fundamental to succeed in controlling the variables influencing the programming phase, at least the most significant ones, to limit the natural distribution of values connected to different memory cells in an acceptable way.

BRIEF SUMMARY OF THE INVENTION

Embodiments of this invention provide a programming voltage regulator for non-volatile memory cells and a method for controlling programming voltage levels of non-volatile memory cells, having such structural and functional features as to allow precisely set programming voltage values to be obtained, using simple and thus reliable circuit patterns, overcoming the drawbacks still affecting prior art devices.

The embodiments provide a feedback mechanism to take into account the variations of the intrinsic features of memory cells for regulating the programming voltage of such cells.

The method comprises providing a resistive divider connected to a programming voltage reference and effective to generate at least one programming voltage level and providing a reference cell crossed by a cell current, which is applied to the resistive divider to correlate the programming voltage level to the intrinsic features of the reference cell. The cell current is applied to the resistive divider in shunt configuration.

The programming voltage regulator comprises at least an input stage inserted between a first and a second voltage reference and connected to a reference memory cell, as well as, in correspondence with the output terminal thereof, to a resistive divider, in turn inserted between a programming voltage reference and the second voltage reference and connected to at least an output terminal of the regulator, effective to supply the programming voltage to the non-volatile memory cells, the output terminal of the input stage being connected to a first circuit node of the resistive divider in correspondence with an end of a resistive element comprised in the resistive divider and having a further end connected to the programming voltage reference, a voltage value on the first circuit node being thus obtained by shunting the programming voltage reference. The reference memory cell is identical to the non-volatile memory cells to be programmed.

According to one embodiment, the programming voltage regulator is capable to soften the effects of external supply voltage reference variations.

The features and advantages of the method and regulator according to the invention will be apparent from the following description of one or more embodiments thereof given by way of non-limiting examples with reference to the attached drawings.

DETAILED DESCRIPTION

Figure 1A:
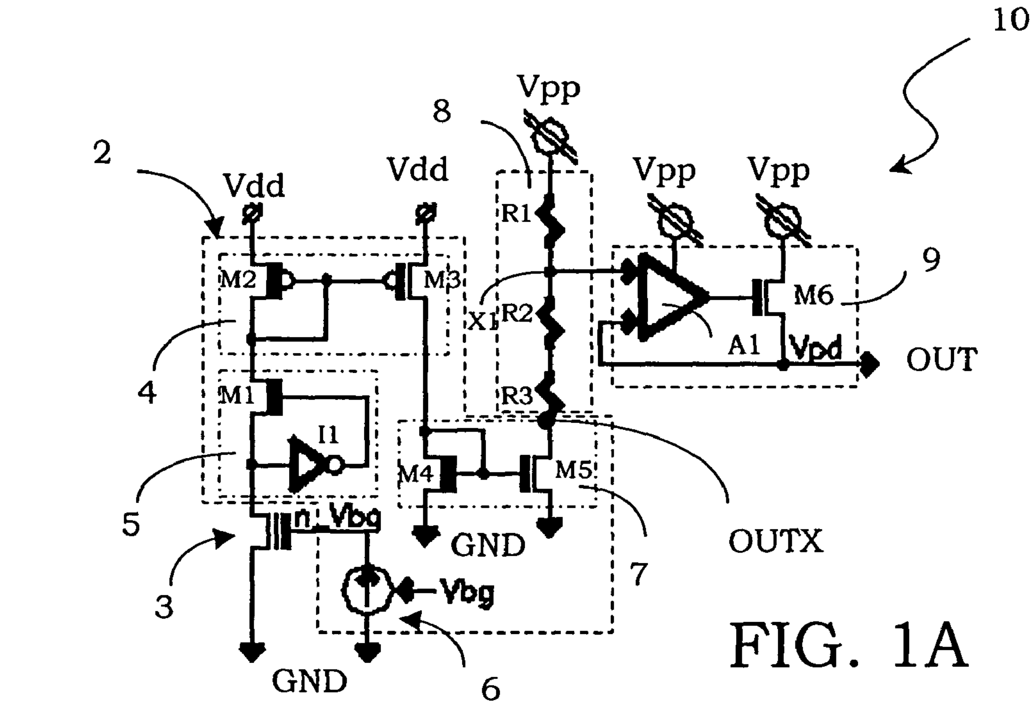
FIGS. 1A and 1B schematically show a first embodiment of the programming voltage regulator effective to implement the method for controlling programming voltage levels, for a two-level memory cell and a multilevel cell respectively.

Embodiments of a method for controlling programming voltage levels of non-volatile memory cells, the method tracking the cell features, and corresponding voltage regulator are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

An embodiment of this invention describes a method for controlling the programming voltage level of non volatile memory cells taking into account the variations of the cell intrinsic features.

In particular, the control method provides the use of a resistive divider connected to a programming voltage reference Vpp and effective to generate at least a programming voltage level for non-volatile memory cells through a suitable amplifier output stage.

To this purpose, a current flowing in a reference cell is applied to the resistive divider to influence the generated programming voltage level. Advantageously according to an embodiment of the invention, the method provides a bleeding of the current flowing in the reference cell to be applied to the divider thus providing a voltage level connected to the reference cell intrinsic features.

Advantageously according to an embodiment of the invention, the reference cell is identical to the memory cells to be programmed in order to optimize the control of the programming voltage level on the features of the cells to be programmed.

In an embodiment of the method, the current flowing in the reference cell is applied to the shunt-configured resistive divider so that increases of the cell current cause decreases of the programming voltage level obtained.

In particular, this cell current is applied to an end of a resistive element comprised in the resistive divider and having a further end connected to the programming voltage reference Vpp.

In such a way, the obtained programming voltage level is connected to the programming fastness of these cells. In fact, in the case of "slow" cells, the reference cell current has a low value and it raises, for shunt effect, the programming voltage level. Similarly, in the case of "fast" cells, the reference cell current has a high value and it decreases, for shunt effect, the programming voltage level.

The method for controlling the programming voltage level of non-volatile memory cells can be immediately applied with multilevel cells, using a plurality of output stages to obtain a plurality of programming voltage levels.

Advantageously according to an embodiment of the invention, the "centering" of obtained programming voltage levels, i.e., the nominal values of these levels, then tracks the cell intrinsic features, due to the application in shunt configuration of the current flowing in the reference cell, as previously described.

In such a way, a separation between the generated programming voltage levels is also obtained, also tracking the cell intrinsic features and particularly the programming "fastness" thereof.

Moreover, it should be noted that, in the case of multilevel applications, the method allows voltage levels to be obtained for a simultaneous multilevel programming which are therefore flexible according to the cell intrinsic features and particularly to the programming "fastness" thereof. In particular, these programming voltage levels are moved closer/away in the case of fast/slow cells to be programmed.

Advantageously according to an embodiment of the invention, not only programming voltage levels but also reciprocal distances are flexible according to the cell intrinsic features and in particular to the programming "fastness" thereof, i.e., these distances are lower/higher in the case of fast/slow cells to be programmed.

In an alternative embodiment of the control method of this invention, a feedback of the current flowing in the resistive divider is also provided to take into account programming voltage reference variations.

In particular, according to this embodiment, the method provides the use of a self-biasing network connected between the resistive divider and the reference cell in order to increase/decrease the value of the cell current applied to the divider itself in case of decreasing/increasing of the programming voltage reference.

Figure 1B:
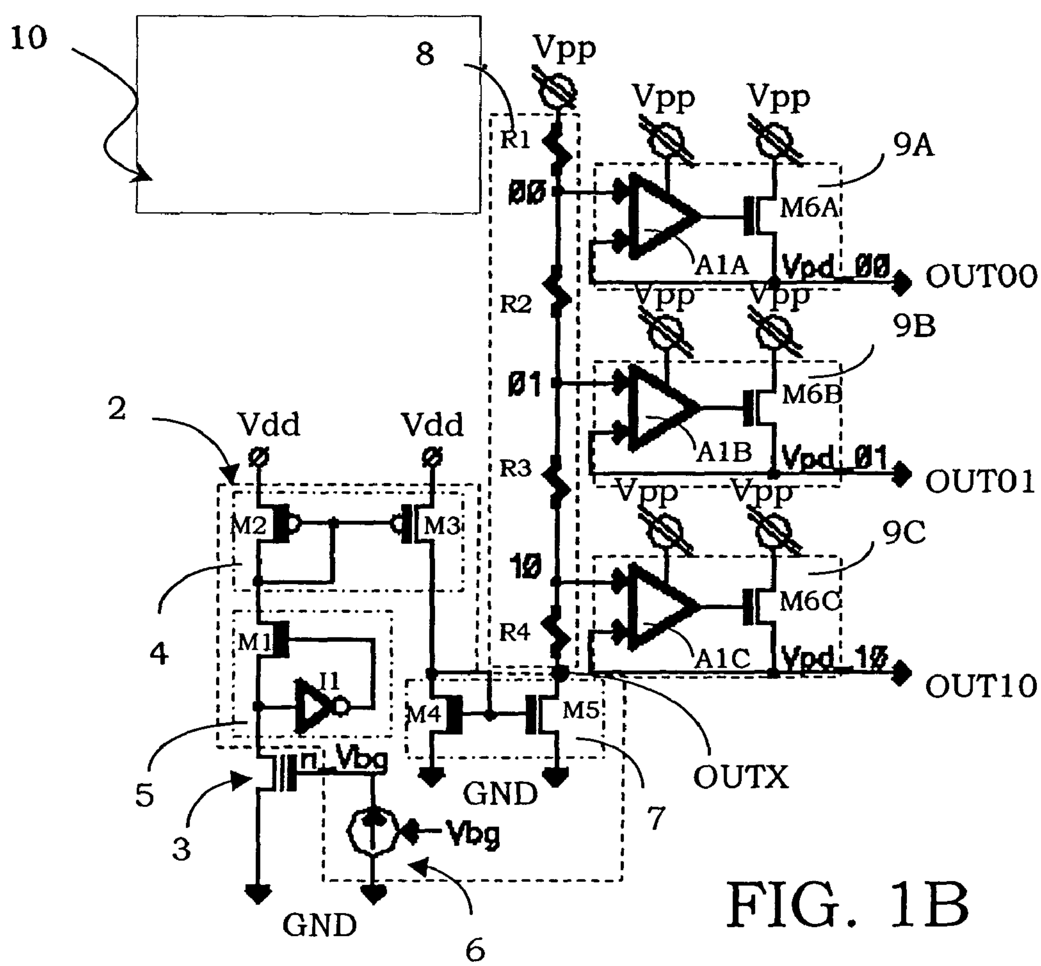

A first embodiment of a drain programming voltage regulator allowing, in a simple way, the method for controlling programming voltage levels of this invention to be implemented is schematically shown in FIGS. 1A and 1B in case of application to a two-level and multilevel memory cell respectively.

The regulator 10 comprises an input stage 2, inserted between a first and a second voltage reference, particularly a supply voltage Vdd and a ground GND and connected to a non-volatile memory cell 3. The cell 3 is a reference cell for the regulation of the drain programming voltage to be applied to the memory cells comprised in a memory device associated to the regulator 10.

In particular, the input stage 2 comprises a biasing block 4, traditionally cascoded by means of a cascode block 5 comprising a transistor M1 inserted between the biasing block 4 and the cell 3 and having the control terminal connected to the cell 3 by means of a buffer 11.

The biasing block 4 in turn comprises a first transistor M2 being diode-connected and inserted between the supply voltage reference Vdd and the cascode block 5, having a control terminal connected to the control terminal of a second transistor M3 in turn connected to the supply voltage reference as well as to a current mirror 7.

The cell 3 receives on its control terminal a control voltage n_Vbg, obtained through a band-gap BG generator 6.

The current mirror 7 comprises a first M4 and a second transistor M5, the latter being series-connected in correspondence with an output terminal OUTX of the input stage 2 to a resistive divider 8, in turn connected to a programming voltage reference Vpp, usually higher than the supply voltage reference Vdd.

The resistive divider 8 comprises a first R1, a second R2 and a third resistive element R3 inserted, in series to each other, between the programming voltage reference Vpp and the current mirror 7 and having a circuit node X1 connected to an output stage 9 of the regulator 10.

The output stage 9 comprises an amplifier A1 powered by the programming voltage reference Vpp and having a first input terminal connected to the circuit node X1 and a second input terminal connected to an output terminal OUT whereat a drain programming voltage Vpd is produced for the cells of a memory device associated to the regulator 10.

The output stage 9 also comprises a transistor M6 inserted between the programming voltage reference Vpp and the output terminal OUT and having a control terminal connected to an output terminal of the amplifier A1.

The regulator 10 is immediately adaptable to the case of multilevel cells, as schematically shown in FIG. 1B. In particular, the regulator 10 comprises in this case a plurality of output stages 9A, 9B, 9C, input-connected to a plurality of circuit nodes 00, 01, 10, defined by resistive elements comprised in the resistive divider 8, as well as to a plurality of output terminals, OUT00, OUT01, OUT10, where respective drain programming voltage values are generated, Vpd_00, Vpd_01, Vpd10, for the different levels of the multilevel cells to be programmed.

The regulator 10 thus performs a bleeding of the current flowing in the reference cell 3, applying the bled current to the resistive divider 8.

In particular, the regulator 10 uses a cell 3 of the memory device associated thereto to draw information linked to the current flowing in the conduction terminals thereof when the cell 3 is conveniently driven through the voltage n_Vbg derived from a band-gap voltage Vgb, usually common to the whole circuit. This cell current value, conveniently mirrored, is used to regulate the voltage value input to the output stage 9 by means of the resistive divider 8, thus obtaining a drain programming voltage Vpd at the output terminal OUT of the regulator 10 (a plurality of drain programming voltages at a plurality of output terminals in the multilevel case). As previously explained, the drain programming voltage is used to fix the threshold voltage value of the cells to be programmed, in order to minimize the number of programming pulses to be applied with constant gate voltage.

Actually, the correlation between the cell current and the programming voltage obtained through this first regulator 10 is incorrect.

In fact, it is easy to verify that, during the regulator 10 operation, a current carried from the input stage 2 and from the current mirror 7 to the resistive divider 8 flows in the cell 3 and an increase of the current flowing in the cell 3 causes an increase of the voltage fall on the resistive elements of the resistive divider 8 and then an increase of the voltage at the input node of the output stage 9 and thus an increase of the drain programming voltage Vpd obtained on the output terminal OUT.

The regulator 10 is thus far from an optimum behavior, since a higher current carried by the cell 3 is actually an index of a batch of more easily programmable cells and it should thus allow lower drain programming voltage value Vpd to be used.

Moreover, fluctuations of the programming voltage reference Vpp affect the voltage obtained through the resistive divider 8 and thus the drain programming voltage value output from the regulator 10.

Finally it is worth remembering that the voltage n_Vbg used by the known regulator 10 to control the cell 3 is usually obtained from the band-gap voltage Vbg, through convenient dividers and current mirrors.

It results thus that the variations of the features of these divider and current mirror internal elements, linked to the technological variations of the processes through which these elements have been manufactured, cause corresponding variations of the cell 3 control voltage n_Vbg, altering the regulator 10 operation.

In order to overcome these drawbacks, a second embodiment is provided of a voltage regulator of this invention globally and schematically indicated with 20 and effective to implement the method of this invention and particularly the cell current shunt.

The regulator 20 comprises an input stage 2, inserted between a first and a second voltage reference, particularly a supply voltage Vdd and a ground GND and connected to a non-volatile memory cell 3.

In particular, the input stage 2 comprises a biasing block 4, traditionally cascoded by means of a cascode block 5 comprising a cascode transistor M1 inserted between the biasing block 4 and the cell 3 and having the control terminal connected to the cell 3 by means of a buffer 11.

The biasing block 4 in turn comprises a first transistor M2 being diode-connected and inserted between the supply voltage reference Vdd and the cascode block 5, having a control terminal connected to the control terminal of a second transistor M3 in turn connected to the supply voltage reference as well as to a current mirror 7 comprising a first M4 and second transistor M5 and connected to an output terminal OUTX of the input stage 2.

The cell 3 receives on its control terminal a control voltage n_Vbg, obtained through a band-gap BG generator 6.

The regulator 20 also comprises a resistive divider 8, inserted between a programming voltage reference Vpp, usually higher than the supply voltage reference Vdd and the ground GND.

The resistive divider 8 comprises a first R1, a second R2 and a third resistive element R3 inserted, in series to each other, between the programming voltage reference Vpp and the ground GND and it has a circuit node Xs connected to an output stage 9 of the regulator 1.

The output stage 9 comprises an amplifier A1 powered by the programming voltage reference Vpp and having a first input terminal connected to the circuit node X1 and a second input terminal connected to an output terminal OUT whereat a drain programming voltage Vpd is produced for the cells of a memory device associated to the regulator 1.

The output stage 9 also comprises a transistor M6 inserted between the programming voltage reference Vpp and the output terminal OUT and having a control terminal connected to an output terminal of the amplifier A1.

Advantageously according to this embodiment, the output terminal OUTX of the input stage 2 is connected to the resistive divider 8 in correspondence with the circuit node Xs. Therefore, the voltage value input to the output stage 9 is obtained by shunting the programming voltage Vpp, the circuit node Xs being located in correspondence with an end of the first resistance R1 having the other end connected to the programming voltage reference Vpp.

Figure 2A:
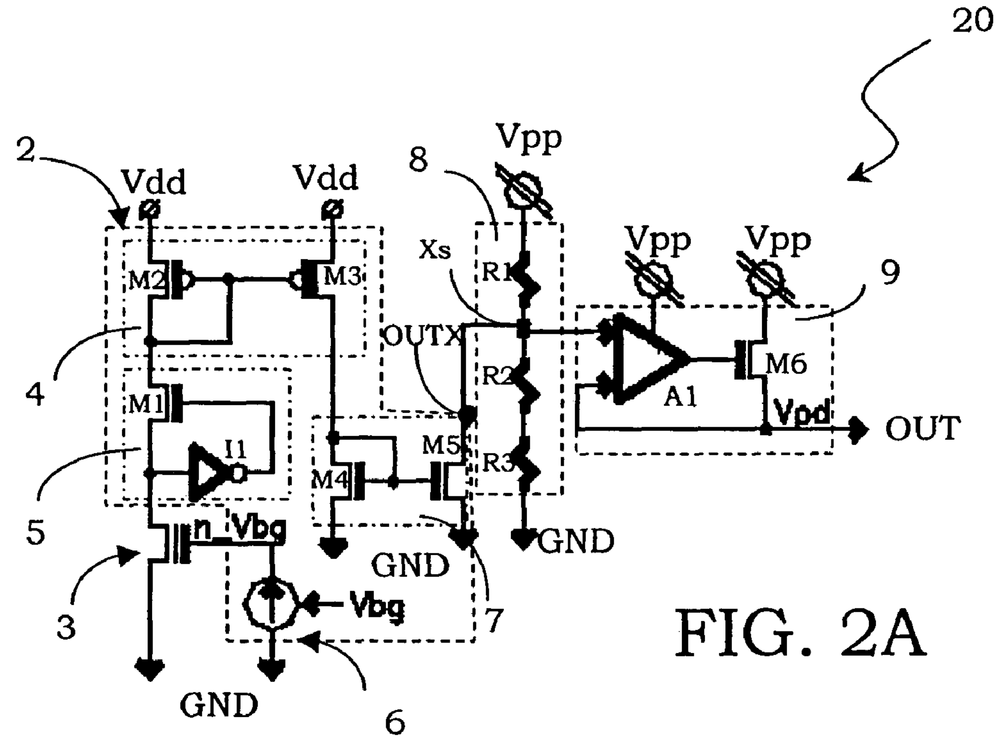
FIGS. 2A an 2B schematically show a second embodiment of the programming voltage regulator, for a two-level memory cell and a multilevel cell respectively.
Figure 2B:
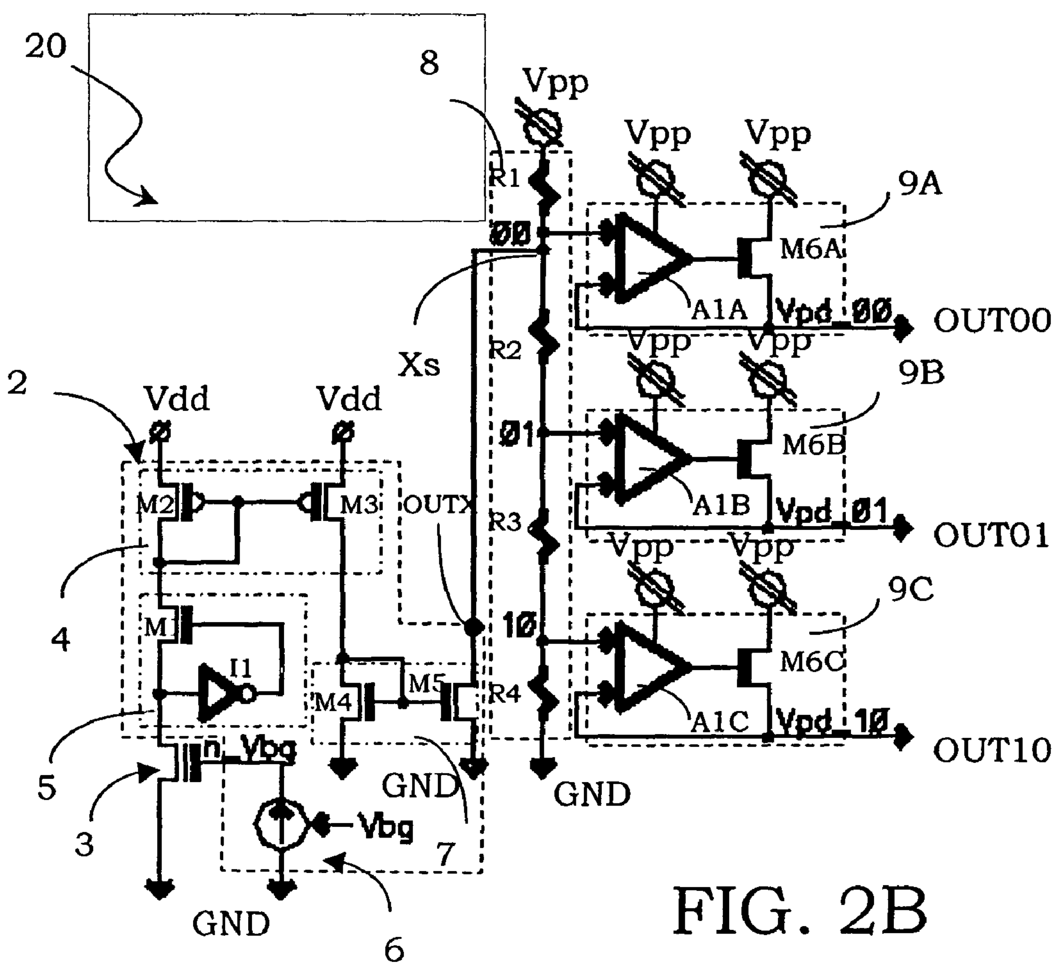

As previously described, the regulator 20 is also immediately adaptable to the case of multilevel cells, as schematically shown in FIG. 2B. In particular, the regulator 20 comprises in this case a plurality of output stages 9A, 9B, 9C, input-connected to a plurality of circuit nodes 00, 01, 10, defined by the resistive elements comprised in the resistive divider 8, as well as to a plurality of output terminals, OUT00, OUT01, OUT10, where respective drain programming voltage values are generated, Vpd_00, Vpd_01, Vpd10, for the different levels of the multilevel cells to be programmed.

Advantageously according to this embodiment, the regulator 20 takes correctly into account the variations in the intrinsic features of the cells to be programmed. In particular, it can be immediately verified that an increase of the current flowing in the cell 3 causes an increase of the voltage drop on the resistive elements of the resistive divider 8 and thus a decrease of the voltage obtained as shunt at the input node to the output stage 9. The regulator 20 provides in this case a lower drain programming voltage Vpd value at the output terminal OUT, taking automatically into account the fact that the considered batch of cells is more easily programmable.

The regulator 20 thus correctly "tracks" the variations of the intrinsic features of the cells to be programmed.

Actually, the control voltage n_Vbg of the cell 3 obtained from a band-gap voltage Vgb is a limitation of the regulator 20 due to the presence of a band-gap generator.

Such a band-gap generator is usually comprised in memory devices and it is shared by the different device circuits. It is however an extremely complex bulky and rather slow circuit in the memory device starting phases. In particular, the band-gap generator is set in the testing phase and it requires a testing optimization strategy.

Figure 3A:
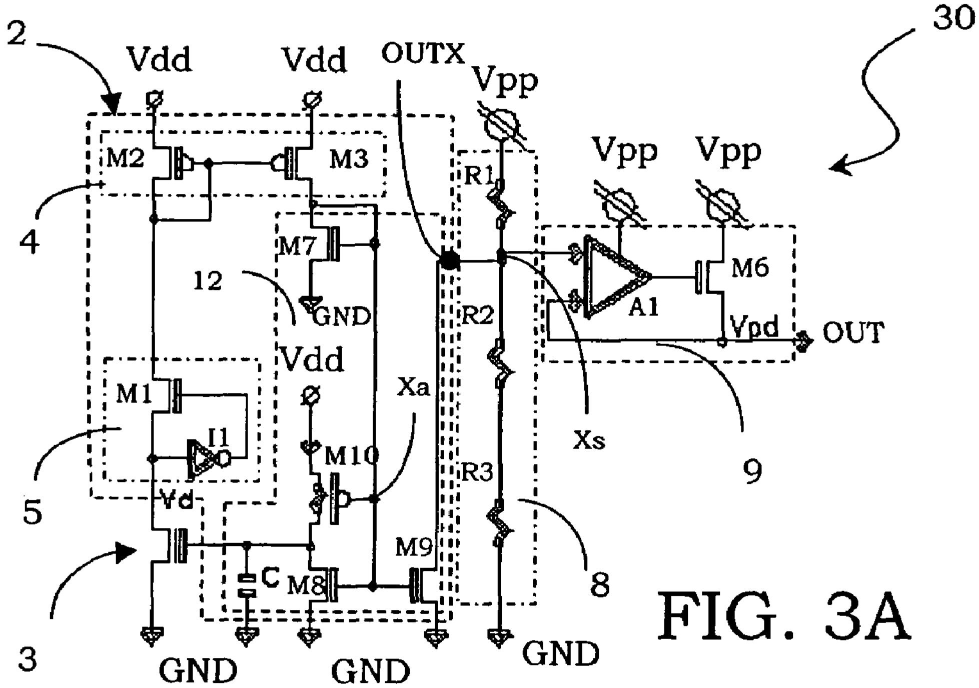
FIGS. 3A an 3B schematically show a third embodiment of the programming voltage regulator, for a two-level memory cell and a multilevel cell respectively.
Figure 3B:
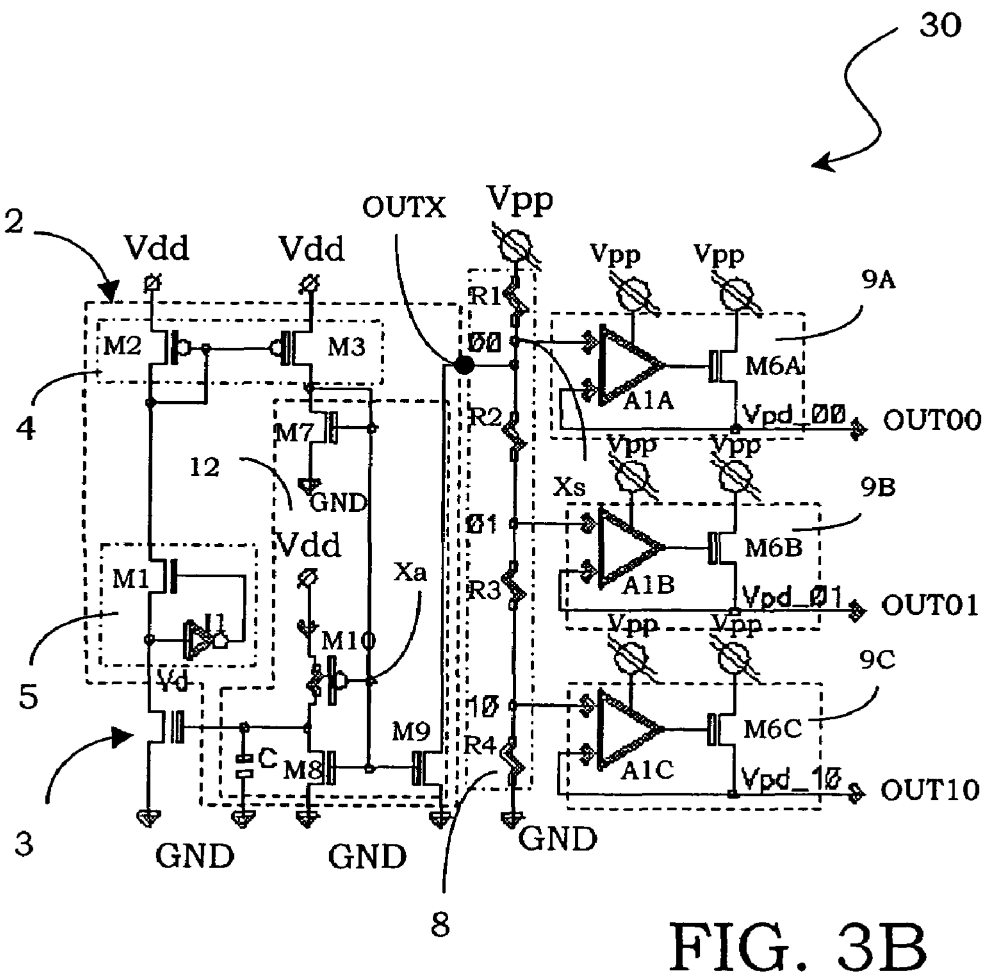

These limitations have been taken into account in an alternative embodiment of the regulator 20, obtaining a third embodiment of a regulator 30 of this invention schematically shown in FIGS. 3A and 3B, in the two-level and multilevel case respectively.

In particular, the regulator 30 comprises in the input stage 2 a self-biasing network 12, inserted between the biasing block 4 and the ground GND.

The self-biasing network 12 comprises a first transistor M7 inserted between the biasing block 4 and the ground GND and having a control terminal connected to a circuit node Xa, in turn connected to common control terminals of a second M8 and third transistor M9 of the self-biasing network 12.

In particular, the second transistor M8 is inserted between the control terminal of the cell 3 and the ground GND, while the third transistor M7 is connected to the ground GND and to the output terminal OUTX of the input stage 2, in turn connected to the circuit node Xs of the resistive divider 8.

The self-biasing network 12 comprises a further resistive transistor M10, inserted between the supply voltage reference Vdd and the control terminal of the cell 3 and having in turn the control terminal connected to the circuit node Xa.

Finally, the self-biasing network 12 comprises a capacitor C inserted in parallel with the second transistor M8 between the control terminal of the cell 3 and the ground GND.

Advantageously according to this embodiment, the third transistor M9 of the self-biasing network 12 is further connected to the circuit node Xs of the resistive divider 8.

It should be noted that the self-biasing network 12 forms a feedback path connected to the cell 3 and it takes into account the variations of the current flowing therein. In fact, the self-biasing network 12 bleeds a part of the current flowing in the cell 3 and it provides it—in shunt configuration—to the divider 8, varying correctly the voltage input to the output stage 9 and, consequently, the drain programming voltage value Vpd being output.

In substance, the regulator 30 thus obtained allows a drain programming voltage to be obtained, which is "latched" to the cell 3 features by means of the self-biasing network 12, with no need to use the tricky band-gap generator.

Unfortunately also, this embodiment of the regulator is however affected by the variations of the programming voltage reference Vpp to which the resistive divider 8 is coupled.

These variations cause, as already previously described, variations of the drain programming voltage Vpd value obtained at the regulator output terminal OUT and they are extremely detrimental in multilevel contexts, where a distribution of drain programming voltage values Vpd_00, Vpd_01, Vpd_10 contained in predetermined ranges is to be obtained.

Figure 4A:
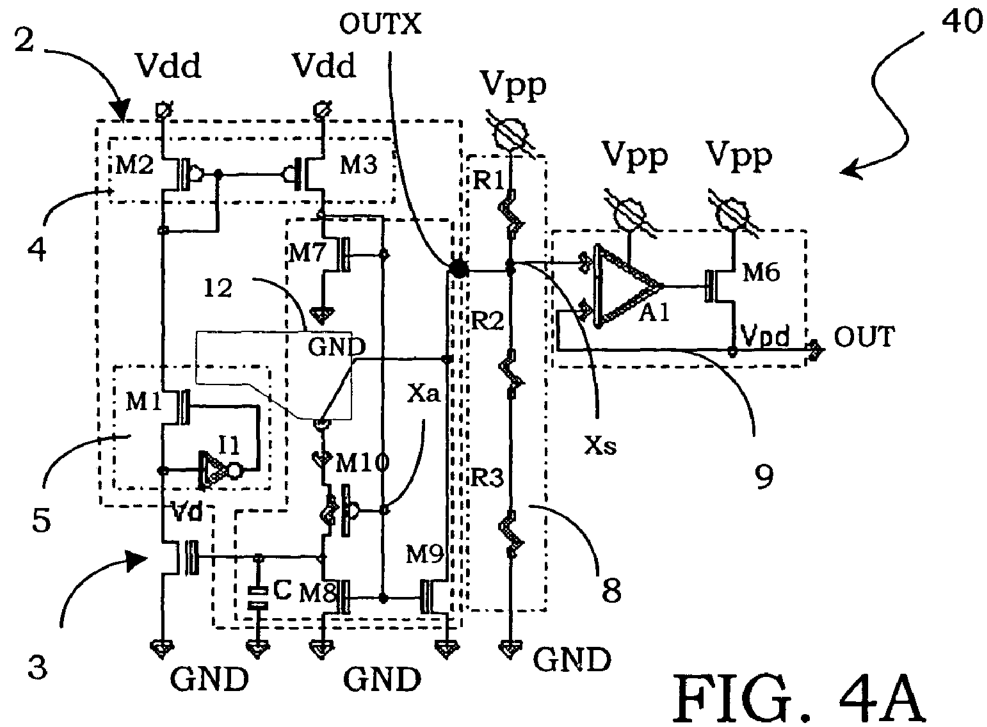
FIGS. 4A an 4B schematically show a fourth embodiment of the programming voltage regulator, for a two-level memory cell and a multilevel cell respectively.
Figure 4B:
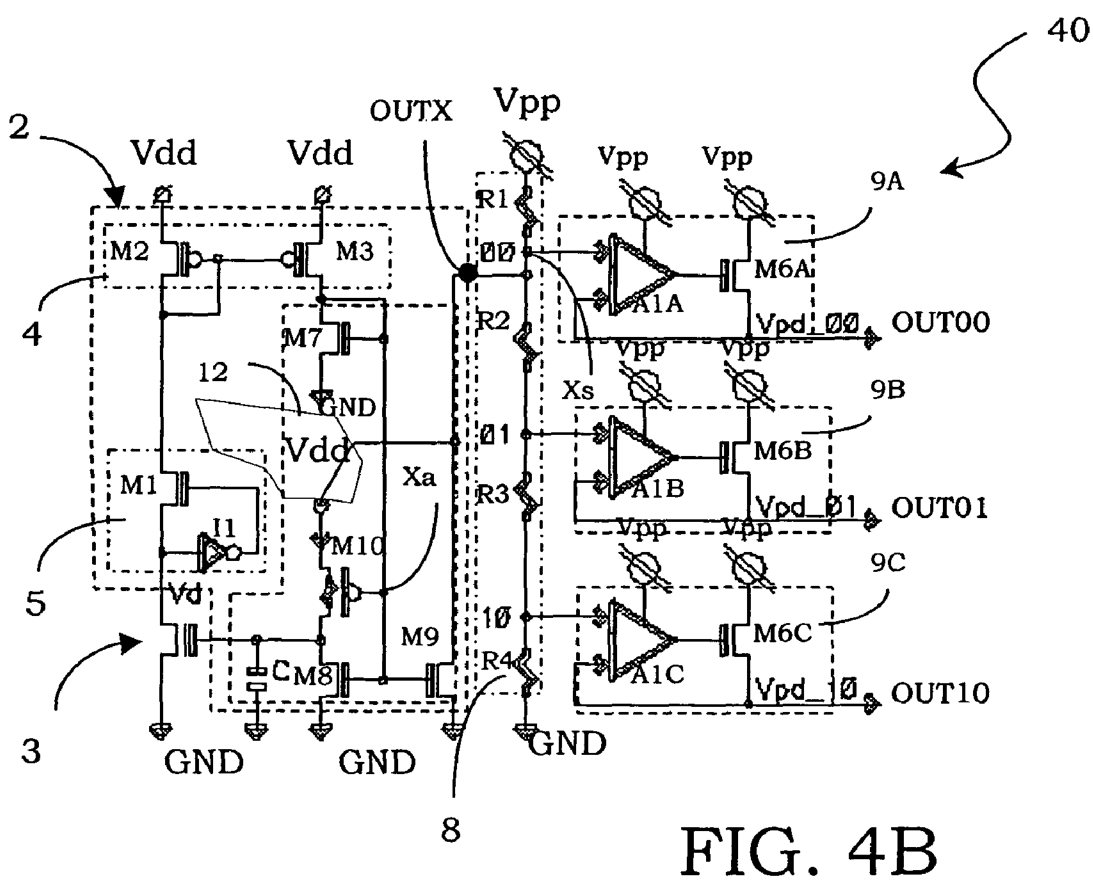

In a fourth alternative embodiment of the regulator of this invention, these limitations have been taken into account, obtaining a regulator 40 schematically shown in FIGS. 4A and 4B, in the two-level and multilevel case respectively.

In particular, the regulator 40 comprises as previously a self-biasing network inserted between the biasing block 4 and the ground GND and comprising the transistors M7, M8, M9 and M10. In this alternative embodiment, the transistor M10 has a control terminal connected to the circuit node Xa and it is inserted between the control terminal of the cell 3 and the output terminal OUTX of the input stage 2, connected in turn to the circuit node Xs in connection with the resistive divider 8.

Figure 6:
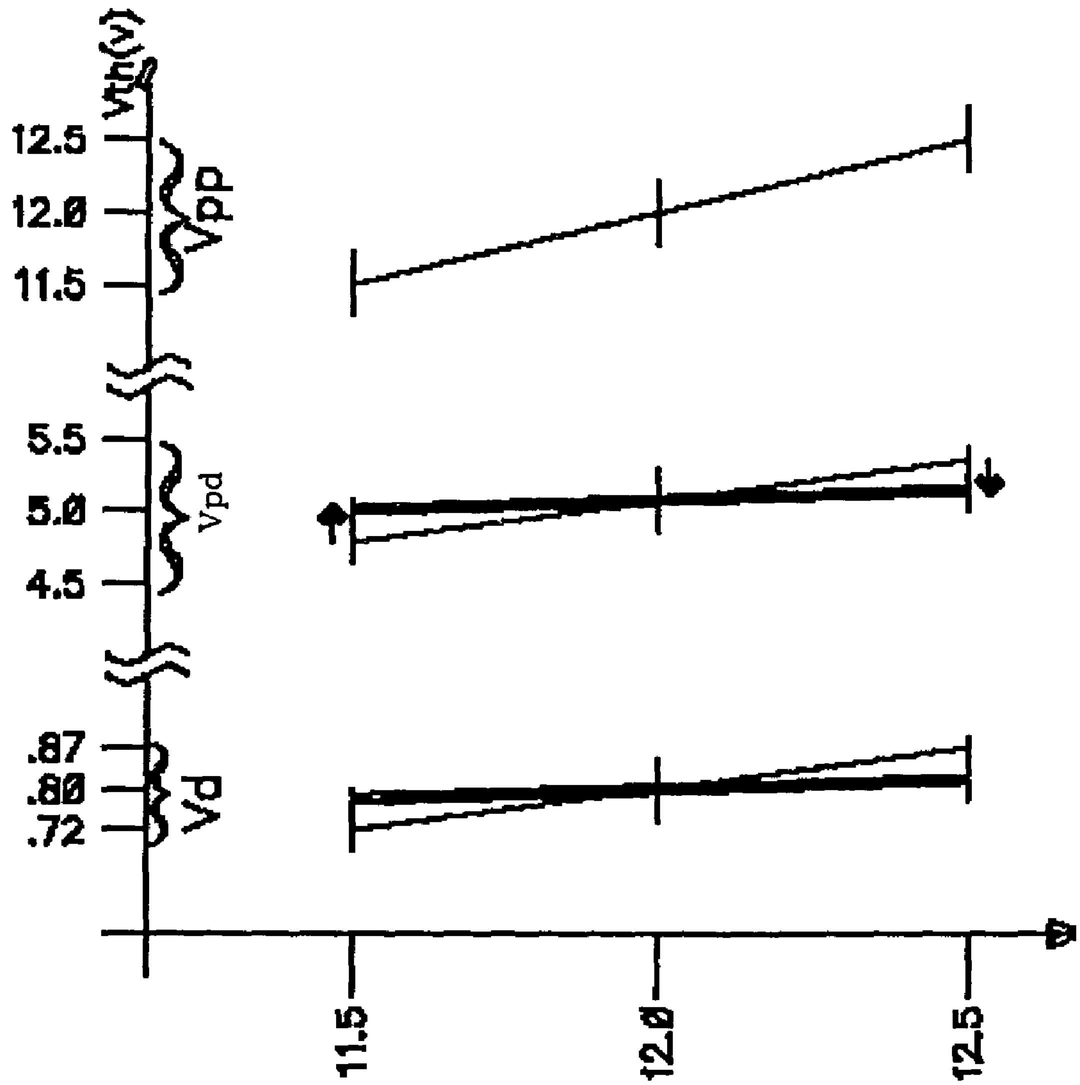
FIG. 6 schematically shows the pattern time vs. programming voltage values obtained through a prior art regulator and a regulator according to an embodiment of the invention respectively.

It can be immediately verified that the regulator 40 thus obtained performs, through the self-biasing network 12, a variation compensation of the programming voltage Vpp. In particular, in case of an increase of this programming voltage Vpp, the self-biasing network 12 bleeds in correspondence with the circuit node Xs a part of this increased current and it puts it on the cell 3 through the feedback obtained by the self-biasing network 12. The cell 3 thus provides a higher current and it decreases, in such a way, a voltage value Vs at the circuit node Xs and so the programming voltage value Vpd, thus reducing the increase due to the programming voltage Vpp increase. The same mechanism is valid in case of decreases of the programming voltage Vpp, as schematically shown in FIG. 6.

In other words, advantageously according to this alternative embodiment, it is possible to obtain a drain programming voltage value Vpd output from this regulator tracking the features of the cells to be programmed and capable of self-compensating variations of the programming voltage Vpp.

It should be noted that such a regulator 40, in multilevel contexts, allows distributions of drain programming voltage Vpd_00, Vpd_01, Vpd_10 to be obtained for programming simultaneously the different levels of multilevel cells which remain unchanged with respect to the variations of the programming voltage reference Vpp though being modulated with the variations of the cell features.

Figure 5A:
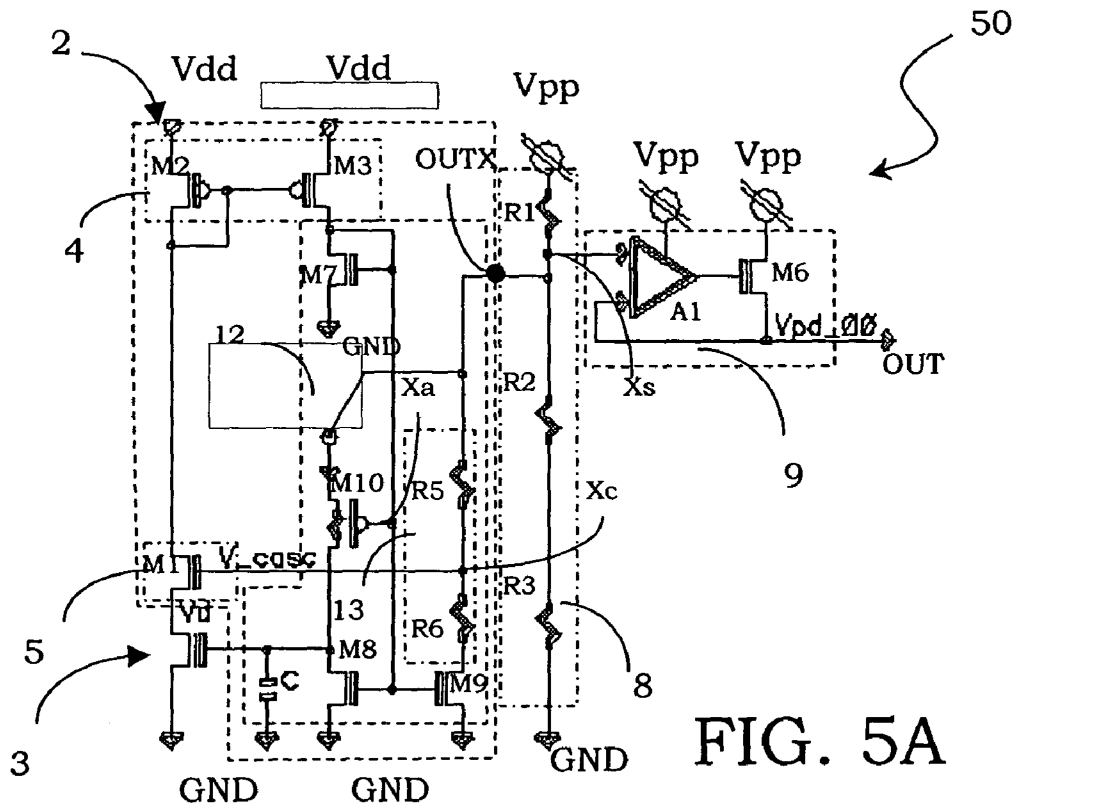
FIGS. 5A an 5B schematically show a fifth embodiment of the programming voltage regulator, for a two-level memory cell and a multilevel cell respectively.
Figure 5B:
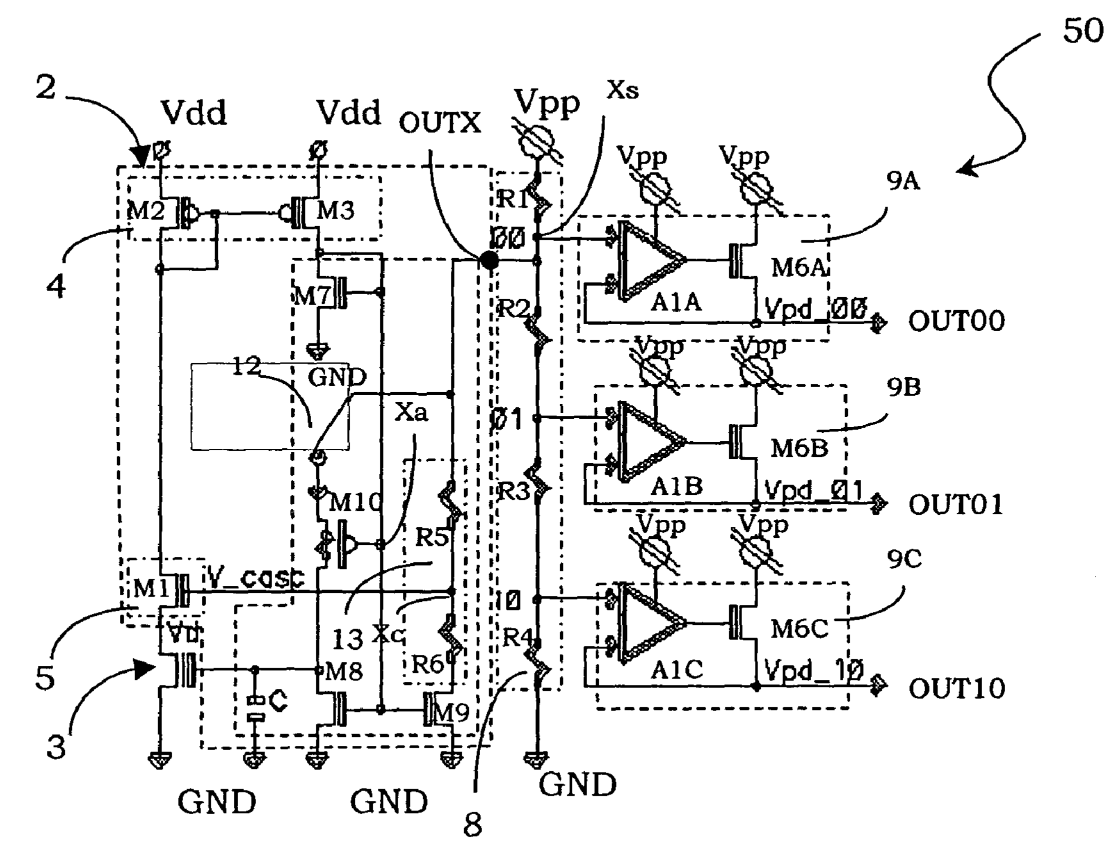

Finally, in accordance with a fifth alternative embodiment of the regulator of this invention, also the cascode operation of the cell 3 is coupled to the programming voltage variations Vpp, obtaining a regulator 50 as schematically shown in FIGS. 5A and 5B.

In particular, the regulator 50 comprises a cascode transistor M1 inserted between the biasing block 4 and the cell 3 and having a control terminal connected to a circuit node Xc, the circuit node Xc of a second resistive divider 13 being comprised in the self-biasing network 12.

The second resistive divider 13 is inserted between the circuit node Xa and the third transistor M9 of the self-biasing network 12 and it comprises a first R5 and a second resistive element R6 interconnected in correspondence with the circuit node Xc, where a cascode voltage V_case is generated to be applied to the control terminal of the cascode transistor M1.

Advantageously according to this fifth alternative embodiment it is possible, through the cascode transistor M1, to further soften the effects of the programming voltage Vpp variations.

It should be noted that in all the voltage regulator configurations according to embodiments of the invention both the "centering" and the "separation" between the different levels of multilevel applications is coupled to the "programming fastness" feature of the cell concerned: the more rapid this cell is in programming, the lowest the centering level of the programming voltage Vpd_00 obtained according to embodiments of the invention is. In fact, the current ΔV R1 in the resistive divider 8 is increased as a result of the shunt current applied to the circuit node Xs starting from the current of the reference cell 3. As a consequence, underlying levels Vpd_01, Vpd_10 are lower and more compressed.

In conclusion, the regulator according to embodiments of the invention allows drain programming voltage values to be obtained, both for two-level applications and for multilevel applications, whose values are latched to the features of the cells to be programmed, because of the shunt configuration, and, in the meantime, they have a limited dependence on programming voltage variations, due to the use of a conveniently feedback self-biasing network.

The regulator according to embodiments of the invention thus performs an effective control of the drain programming voltage and it allows both the variation of the conductivity of the non volatile memory cells to be programmed and the duration of the pulses required for the programming to be managed more uniformly, particularly in case of parallel programming of multilevel memory cells.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for controlling programming voltage levels of non-volatile memory cells, the method comprising:

providing a resistive divider connected to a programming voltage reference and effective to generate at least one programming voltage level;

providing a reference cell crossed by a cell current; and wherein cell current is applied to the resistive divider to correlate the programming voltage level to intrinsic features of the reference cell, wherein the cell current is applied to the resistive divider in shunt configuration.

2. A control method according to claim 1 wherein the cell current is applied to an end of a resistive element comprised in the resistive divider and having a further end connected to the programming voltage reference.

3. A method for controlling programming voltage levels of non-volatile memory cells, the method comprising:

providing a resistive divider connected to a programming voltage reference and effective to generate at least one programming voltage level;

providing a reference cell crossed by a cell current, wherein the reference cell is identical to the non-volatile memory cells to be programmed; and wherein cell current is applied to the resistive divider to correlate the programming voltage level to intrinsic features of the reference cell.

4. A method for controlling programming voltage levels of non-volatile memory cells, the method comprising:

providing a resistive divider connected to a programming voltage reference and effective to generate at least one programming voltage level;

providing a reference cell crossed by a cell current; and wherein cell current is applied to the resistive divider to correlate the programming voltage level to intrinsic features of the reference cell, generating the programming voltage level with a high, respectively low, value for a low, respectively high, value of the cell current.

5. A method for controlling programming voltage levels of non-volatile memory cells, the method comprising:

providing a resistive divider connected to a programming voltage reference and effective to generate at least one programming voltage level;

providing a reference cell crossed by a cell current;

wherein cell current is applied to the resistive divider to correlate the programming voltage level to intrinsic features of the reference cell; and the resistive divider generating a plurality of programming voltage levels, wherein the programming voltage levels are obtained with a centering and separation correlated to intrinsic features of the non-volatile memory cells to be programmed.

6. A control method according to claim 4 wherein the voltage levels are moved closer, respectively away, in the case of fast, respectively slow, memory cells to be programmed.

7. A control method according to claim 4 wherein the voltage levels have reciprocal distances being lower, respectively higher, in the case of fast, respectively slow, non-volatile memory cells to be programmed.

8. A method for controlling programming voltage levels of non-volatile memory cells, the method comprising:

providing a resistive divider connected to a programming voltage reference and effective to generate at least one programming voltage level;

providing a reference cell crossed by a cell current;

wherein cell current is applied to the resistive divider to correlate the programming voltage level to intrinsic features of the reference cell; and providing a feedback of a current flowing in the resistive divider to correlate the programming voltage level to variations of the programming voltage reference.

9. A control method according to claim 8 wherein the feedback increases, respectively decreases, the cell current value applied to the divider in case of decrease, respectively increase, of the programming voltage reference.

10. A programming voltage regulator of non-volatile memory cells comprising at least an input stage inserted between a first and a second voltage reference and connected to a reference memory cell, as well as, in correspondence with an output terminal of the input stage, to a resistive divider, in turn inserted between a programming voltage reference and the second voltage reference and connected to at least an output terminal of the regulator, effective to supply a programming voltage to the non-volatile memory cells, wherein the output terminal of the input stage is connected to a first circuit node of the resistive divider in correspondence with an end of a resistive element included in the resistive divider and having a further end connected to the programming voltage reference, a voltage value on the first circuit node being thus obtained by shunting the programming voltage reference.

11. A voltage regulator according to claim 10 wherein the reference memory cell is identical to the non-volatile memory cells to be programmed.

12. A voltage regulator according to claim 10 wherein the reference memory cell has a control terminal connected to a band-gap voltage reference.

13. A voltage regulator according to claim 10 wherein the reference memory cell has a control terminal connected to a self-biasing network inserted between the first and second voltage reference and including a first transistor inserted between the first and second voltage reference and having a control terminal connected to a second circuit node, a second transistor inserted between the control terminal of the reference memory cell and the second voltage reference and a third transistor connected to the second voltage reference and to the output terminal of the input stage, the second and third transistor having control terminals connected to each other and to the second circuit node.

14. A voltage regulator according to claim 13 wherein the self-biasing network further comprises a capacitor inserted in parallel to the second transistor between the control terminal of the reference memory cell and the second voltage reference.

15. A voltage regulator according to claim 14 wherein the self-biasing network further comprises a fourth transistor inserted between the first voltage reference and the control terminal of the reference memory cell and having a control terminal connected to the second circuit node.

16. A voltage regulator according to claim 14 wherein the self-biasing network further comprises a fourth transistor inserted between the output terminal of the input stage and the control terminal of the reference memory cell and having a control terminal connected to the second circuit node.

17. A voltage regulator according to claim 10 wherein the input stage comprises a cascode block inserted between a biasing block and the reference memory cell, the biasing block comprising a first transistor being diode-connected and inserted between the first voltage reference and the cascode block, and a second transistor connected to the first voltage reference and having a control terminal connected to a control terminal of the first transistor.

18. A voltage regulator according to claim 17 wherein the cascode block comprises a cascode transistor inserted between the biasing block and the reference memory cell and having a control terminal connected through a buffer to the reference memory cell.

19. A voltage regulator according to claim 17 wherein the cascode block comprises a cascode transistor inserted between the biasing block and the reference memory cell and having a control terminal connected to a third circuit node of a second resistive divider included in a self-biasing network.

20. A voltage regulator according to claim 19 wherein the second resistive divider is inserted between a second circuit node and a third transistor of the self-biasing network and includes a first and a second resistive element interconnected in correspondence with the third circuit node.

21. A voltage regulator according to claim 10, further comprising an output stage inserted between the programming voltage reference and the output terminal of the regulator and connected to the first circuit node of the resistive divider, the output stage including an amplifier powered by the programming voltage reference and having a first input terminal connected to the first circuit node and a second input terminal connected to the output terminal, as well as a transistor inserted between the programming voltage reference and the output terminal and having a control terminal connected to an output terminal of the amplifier.

22. A programming voltage regulator of non-volatile multilevel memory cells comprising at least an input stage inserted between a first and a second voltage reference and connected to a reference memory cell, as well as, in correspondence with an output terminal of the input stage, to a resistive divider, in turn inserted between a programming voltage reference and the second voltage reference and having a plurality of circuit nodes connected to a plurality of output terminals of the regulator, effective to supply a plurality of programming voltage values for different levels of multilevel non-volatile memory cells, wherein the output terminal of the input stage is connected to a first circuit node of the resistive divider in correspondence with an end of a resistive element included in the resistive divider and having a further end connected to the programming voltage reference, a voltage value on the first circuit node being thus obtained by shunting the programming voltage reference.

23. A voltage regulator according to claim 22, further comprising a plurality of output stages, input-connected to the plurality of circuit nodes of the resistive divider, as well as to a plurality of output terminals to provide the plurality of programming voltage values for different levels of multilevel non-volatile memory cells.

24. A voltage regulator according to claim 22 wherein the reference memory cell is identical to the non-volatile memory cells to be programmed.

25. A voltage regulator according to claim 22 wherein the reference memory cell has a control terminal connected to a band-gap voltage reference.

26. A voltage regulator according to claim 22 wherein the reference memory cell has a control terminal connected to a self-biasing network inserted between the first and second voltage reference and including a first transistor inserted between the first and second voltage reference and having a control terminal connected to a second circuit node, a second transistor inserted between the control terminal of the reference memory cell and the second voltage reference and a third transistor connected to the second voltage reference and to the output terminal of the input stage, the second and third transistor having control terminals connected to each other and to the second circuit node.

27. A voltage regulator according to claim 26 wherein the self-biasing network further comprises a capacitor inserted in parallel to the second transistor between the control terminal of the reference memory cell and the second voltage reference.

28. A voltage regulator according to claim 27 wherein the self-biasing network further comprises a fourth transistor inserted between the first voltage reference and the control terminal of the reference memory cell and having a control terminal connected to the second circuit node.

29. A voltage regulator according to claim 27 wherein the self-biasing network further comprises a fourth transistor inserted between the output terminal of the input stage and the control terminal of the reference memory cell and having a control terminal connected to the second circuit node.

30. A voltage regulator according to claim 22 wherein the input stage comprises a cascode block inserted between a biasing block and the reference memory cell, the biasing block comprising a first transistor being diode-connected and inserted between the first voltage reference and the cascode block, and a second transistor connected to the first voltage reference and having a control terminal connected to a control terminal of the first transistor.

31. A voltage regulator according to claim 30 wherein the cascode block comprises a cascode transistor inserted between the biasing block and the reference memory cell and having a control terminal connected through a buffer to the reference memory cell.

32. A voltage regulator according to claim 30 wherein the cascode block comprises a cascode transistor inserted between the biasing block and the reference memory cell and having a control terminal connected to a third circuit node of a second resistive divider included in a self-biasing network.

33. A voltage regulator according to claim 32 wherein the second resistive divider is inserted between a second circuit node and a third transistor of the self-biasing network and includes a first and a second resistive element interconnected in correspondence with the third circuit node.

34. An apparatus to control programming voltage levels of non-volatile memory cells, the apparatus comprising:

a reference cell to generate a cell current representative of intrinsic features of the reference cell;

a circuit block having an input terminal coupled to the reference cell to receive the cell current and having an output terminal to provide an output voltage that can change in response to a change in the cell current, wherein the output voltage provided by the circuit block is a shunt of a programming voltage reference; and a resistive divider, coupled to the output terminal of the circuit block, to receive the output voltage and to generate at least one programming voltage level value therefrom that is correlated to the intrinsic features of the reference cell.

35. An apparatus to control programming voltage levels of non-volatile memory cells, the apparatus comprising:

a reference cell to generate a cell current representative of intrinsic features of the reference cell;

a circuit block having an input terminal coupled to the reference cell to receive the cell current and having an output terminal to provide an output voltage that can change in response to a change in the cell current; and a resistive divider, coupled to the output terminal of the circuit block, to receive the output voltage and to generate at least one programming voltage level value therefrom that is correlated to the intrinsic features of the reference cell, wherein the circuit block includes:

a biasing block;

a cascode block coupled between the biasing block and the reference cell; and a self-biasing network coupled to the biasing block and to the resistive divider.

36. An apparatus to control programming voltage levels of non-volatile memory cells, the apparatus comprising:

a reference cell to generate a cell current representative of intrinsic features of the reference cell;

a circuit block having an input terminal coupled to the reference cell to receive the cell current and having an output terminal to provide an output voltage that can change in response to a change in the cell current; and a resistive divider, coupled to the output terminal of the circuit block, to receive the output voltage and to generate at least one programming voltage level value therefrom that is correlated to the intrinsic features of the reference cell, wherein the resistive divider includes a plurality of nodes, each of the plurality of nodes being coupled to respectively provide a different programming voltage level value for different levels of the non-volatile memory cells.

37. A system for controlling programming voltage levels of non-volatile memory cells, the system comprising:

a means for providing a cell current representative of intrinsic features of a reference cell;

a means for applying the cell current to a resistive divider, wherein the means for applying the cell current to the resistive divider includes at least one of a bias network, cascode network, and self-biasing network; and a means for generating at least one programming voltage level value from the resistive divider based on the applied cell current, the programming voltage level value being responsive to a change in the cell current and being correlated to the intrinsic features of the reference cell.

* * * * *